United States Patent
Kisakibaru et al.

(10) Patent No.: US 6,670,290 B2
(45) Date of Patent: Dec. 30, 2003

(54) MANUFACTURING APPARATUS AND MANUFACTURING METHOD FOR SEMICONDUCTOR DEVICE

(76) Inventors: Toshiro Kisakibaru, c/o Sony Corporation, 7-35, Kitashinagawa 6-chome, Shinagawa-ku, Tokyo 141 (JP); Isao Honbori, c/o Sony Corporation, 7-35, Kitashinagawa 6-chome, Shinagawa-ku, Tokyo 141 (JP); Yasushi Kato, c/o Sony Corporation, 7-35, Kitashinagawa 6-chome, Shinagawa-ku, Tokyo 141 (JP); Toshikazu Suzuki, c/o Sony Corporation, 7-35, Kitashinagawa 6-chome, Shinagawa-ku, Tokyo 141 (JP); Hirohisa Koriyama, c/o Sony Corporation, 7-35, Kitashinagawa 6-chome, Shinagawa-ku, Tokyo 141 (JP); Hayato Iwamoto, c/o Sony Corporation, 7-35, Kitashinagawa 6-chome, Shinagawa-ku, Tokyo 141 (JP); Hitoshi Abe, c/o Sony Corporation, 7-35, Kitashinagawa 6-chome, Shinagawa-ku, Tokyo 141 (JP)

( * ) Notice: Subject to any disclaimer, the term of this patent is extended or adjusted under 35 U.S.C. 154(b) by 28 days.

(21) Appl. No.: 09/978,614

(22) Filed: Oct. 16, 2001

(65) Prior Publication Data

US 2002/0090283 A1 Jul. 11, 2002

(30) Foreign Application Priority Data

Oct. 16, 2000 (JP) .................................... P2000-315363

(51) Int. Cl.[7] .................... H01L 21/31; H01L 21/469; B01L 1/04
(52) U.S. Cl. ..................... 438/800; 438/907; 454/187; 55/385.2
(58) Field of Search ................... 438/800, 907; 55/385.2, 484; 454/187, 228, 238; 414/271

(56) References Cited

U.S. PATENT DOCUMENTS

| | | | | |
|---|---|---|---|---|
| 4,838,150 A | * | 6/1989 | Suzuki et al. | 98/31.5 |
| 5,181,819 A | * | 1/1993 | Sakata et al. | 414/217 |
| 5,326,316 A | * | 7/1994 | Hashimoto et al. | 454/187 |
| 6,033,301 A | * | 3/2000 | Suwa | 454/187 |
| 6,183,358 B1 | * | 2/2001 | Adair, Jr. | 454/187 |
| 6,514,137 B1 | * | 2/2003 | Panelli et al. | 454/187 |
| 6,517,594 B2 | * | 2/2003 | Olander et al. | 55/385.2 |
| 2001/0044161 A1 | * | 11/2001 | Komiyama | 438/14 |
| 2002/0068524 A1 | * | 6/2002 | Nakagawa | 454/187 |
| 2002/0081962 A1 | * | 6/2002 | Matsuura et al. | 454/187 |

* cited by examiner

Primary Examiner—Alexander Ghyka
(74) Attorney, Agent, or Firm—Robert J. Depke; Holland & Knight, LLC

(57) ABSTRACT

A manufacturing apparatus for a semiconductor device comprises: a clean room for installing a plurality of semiconductor manufacturing and processing apparatuses; an external air cleaning device connected to a supply port of the clean room for supplying a cleaned-up outside air into the clean room; a common air duct section installed in the clean room; a first air cleaning and ventilating means connected to said common air duct section for cleaning and ventilating a part of the cleaned-up outside air to the common air duct section; individual air duct section branched off from the common air duct section and connected to each of said semiconductor manufacturing and processing apparatuses; and a second air cleaning and ventilating means interposed between the individual air duct section and each of the semiconductor manufacturing and processing apparatuses for cleaning and ventilating the air to be supplied to each of the semiconductor manufacturing and processing apparatuses.

4 Claims, 1 Drawing Sheet

MANUFACTURING APPARATUS AND MANUFACTURING METHOD FOR SEMICONDUCTOR DEVICE

RELATED APPLICATION DATA

The present application claims priority to Japanese Application(s) No(s). P2000-315363 filed Oct. 16, 2000, which application(s) is/are incorporated herein by reference to the extent permitted by law.

BACKGROUND OF THE INVENTION

1. Field of the Invention

This invention relates to a manufacturing apparatus and method used for manufacturing various semiconductor devices such as a single semiconductor device, a semiconductor integrated circuit device and the like.

2. Description of the Related Art

In case of manufacturing various types of semiconductor devices such as a single semiconductor device, a semiconductor integrated circuit device or the like, various processes such as an etching process, a CVD (Chemical Vapor Deposition) process, an impurity diffusion process or the like are carried out during manufacturing process.

Recently, demands for miniaturization of a semiconductor device and a demand for high quality of semiconductor device are getting severe and environments of installation location of these semiconductor manufacturing and processing apparatuses for carrying out the above described various processes requires a super cleaned-up atmosphere (super clean room) being realized by the elimination of gaseous chemical material exceeding conventional cleaning up for elimination of dust and fine grain.

These chemical materials are organic gas such as dioctyl phthalate, phosphoric ester, aromatic compound or the like and ozone emitted from, for example, materials used in the semiconductor manufacturing apparatus, and these can not be eliminated by the general cleaning using conventionally known general type fine-grained filter.

Accordingly, elimination of such chemical materials is done by using a chemical filter, for example. But in the manufacture of such semiconductor device, a large number of semiconductor manufacturing and processing apparatuses, for example several hundreds of processing apparatuses, are to be installed within one facility (clean room), and it is very difficult to attach such chemical filter to each of such large number of processing apparatuses because of the complexity of the apparatuses and the increase of the cost.

SUMMARY OF THE INVENTION

According to the present invention, a manufacturing apparatus and method for semiconductor devices without increase of costs in spite of using such large number of semiconductor manufacturing and processing apparatuses are proposed.

Namely, this invention relates to a manufacturing apparatus and method for semiconductor device, wherein relatively large number of semiconductor manufacturing and processing apparatuses are installed at a work area in a clean room. According to the present invention, an external air cleaning device is connected to a supply port for cleaning up an outside air, wherein the external air cleaning device is equipped with a fine grain eliminating filter for cleaning and supplying the outside air into the clean room.

And in the clean room, there are provided a duct means comprising a common air duct section constituting a draft trunk common to a plurality of semiconductor manufacturing and processing apparatus and an individual air duct section branched off from the 30 common air duct section and constituting individual draft trunk to each installation location of the semiconductor manufacturing and various processing apparatus.

At an entrance of the common air duct section, there is provided a pre-stage air cleaning and ventilating means having a chemical filter which cleans up a part of the cleaned-up outside air being supplied into the clean room by the external air cleaning device. Further at each of the individual air duct section, there is provided a post-stage air cleaning and ventilating means having a fan filter unit, and the cleaned-up air by this post-stage air cleaning and ventilating means is then supplied to respective semiconductor manufacturing and processing apparatus.

As described above, according to the semiconductor manufacturing apparatus of the present invention, the outside air is cleaned up by the external air cleaning device and supplied into the clean room, thus cleaned-up air is further cleaned-up by the chemical filter for eliminating organic gas and ozone which are bad for semiconductor device and supplied to semiconductor manufacturing and processing apparatus. In this case, the common supply air duct common to plural processing apparatuses is provided and the chemical filter is put on the common supply air duct, and accordingly simplification of the construction and reduction of manufacturing cost can be realized.

BRIEF DESCRIPTION OF THE DRAWING

The FIGURE shows one example of a manufacturing apparatus for semiconductor device in accordance with the present invention.

DETAILED DESCRIPTION OF THE PREFERRED EMBODIMENTS

Figure 1:
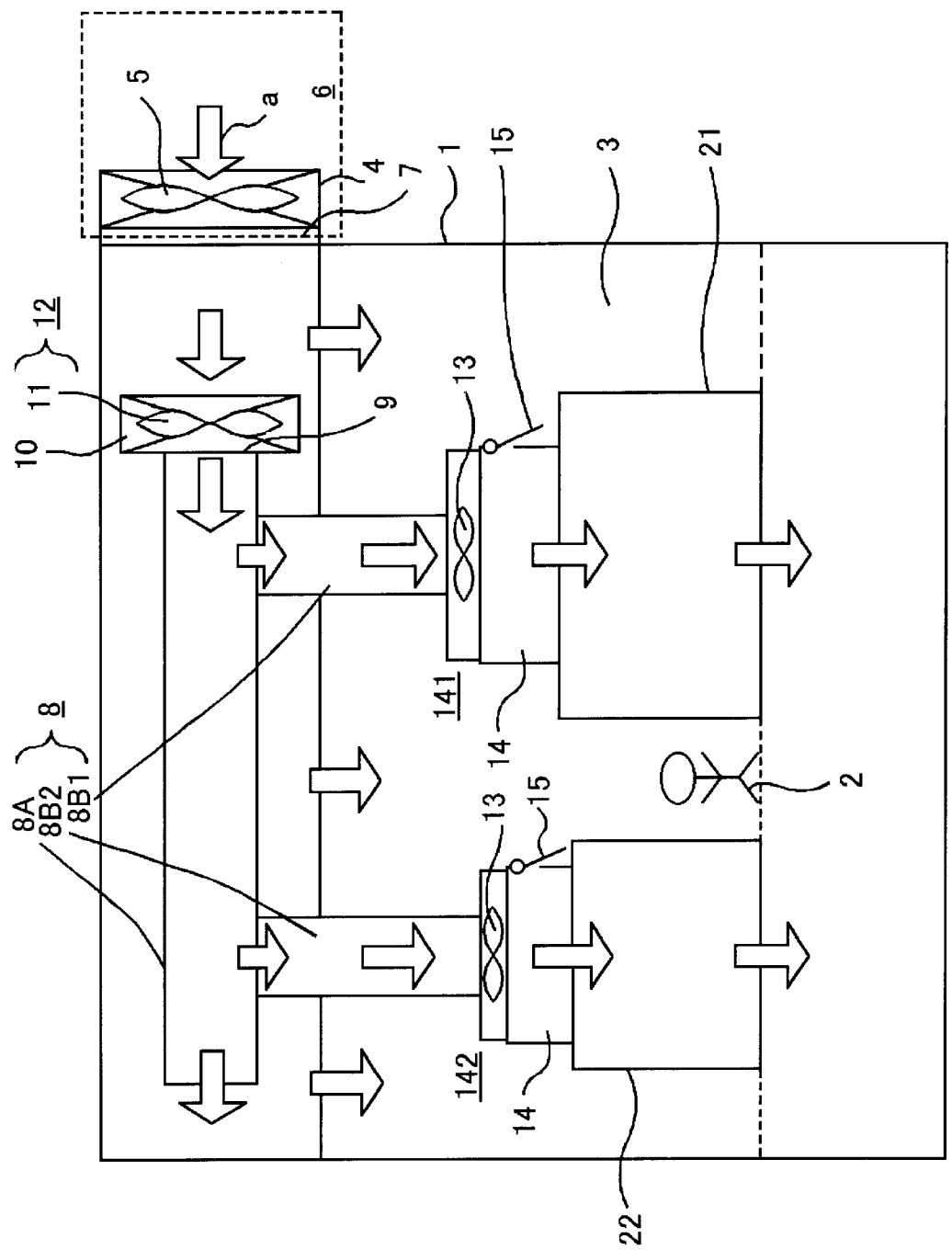

One typical embodiment of a manufacturing apparatus and method for a semiconductor device of the present invention is explained with reference to the accompanying drawing, but this invention is not limited to the embodiment described here-in-after.

In the drawing, it is representatively depicted a condition where a plurality, a first and a second semiconductor manufacturing and processing apparatuses 21 and 22 in the drawing, of semiconductor manufacturing and processing apparatuses is installed at operator's work area 3 of a clean room 1. These semiconductor manufacturing and processing apparatus 21 and 22 are, for example, a CVD (Chemical Vapor Deposition) processing apparatus, a diffusion processing apparatus, an etching processing apparatus, a cleaning processing apparatus or the like, wherein each of these processes is executed within each chamber (not shown) of these apparatuses.

According to this embodiment, so-called down flow system that flows the air from upper to lower below a floor of the work area 3 forms the flow of the air as shown by an arrow directing to down in the figure.

In this case, at upper position of the clean room 1, namely, at a position for a ceiling section, there are provided a fine grain eliminating filter 4 and an external air cleaning device 6 with a ventilator 5 for cleaning up the outside air and supplying the cleaned-up outside air into the clean room 1 through an entrance 7 as shown by an arrow a in the figure.

Further an air duct 8 is installed within the clean room 1. In this case, the air duct 8 comprises a common air duct section 8A that is installed almost along a surface of the ceiling section of the clean room 1 and forms a common draft trunk to the semiconductor manufacturing and processing apparatus 21 and 22 in the clean room 1 and individual air duct section 8B1 and 8B2 branched off from the common air duct section 8A and forms respective draft trunk to each of semiconductor manufacturing and processing apparatus 21 and 22.

And at an entrance 9 for the cleaned-up air of the common air duct section 8A, there is provided a pre-stage air cleaning and ventilating means 12 that supplies a part of cleaned-up outside air from the external air cleaning device 6 and ventilates to a common air duct section 8A of the air duct 8 in the clean room 1.

The pre-stage air cleaning and ventilating means 12 is equipped with a chemical filter 10 for eliminating aforementioned organic gas, ozone or the like and a ventilator 11.

Further at each of individual air duct section 8B1 and 8B2, post-stage air cleaning and ventilating means 141 and 142 are respectively connected with a FFU (Fan Filter Unit) 14 and a ventilator 13.

And at the air cleaning and ventilating means 141 and 142, a minute difference pressure damper 15 is further provided for stabilizing the cleaned-up air supply pressure to the semiconductor manufacturing and processing apparatuses even if a load lock chamber of the semiconductor manufacturing and processing apparatus is kept opened, for example.

Further a highly cleaned-up air by the pre-stage air cleaning and ventilating means 12 is taken into the common air duct section 8A, and branched off into individual air duct section 8B1 and air duct section 8B2. And thus generated super cleaned-up air by the FFU (Fan Filter Unit) 14 of the first and the second post-stage air cleaning and ventilating means 141 and 142 is supplied to respective installation location of processing apparatuses 21 and 22.

And the air supplied to the installation location of the processing apparatuses 21 and 22 is led out to outside through under the floor of the work area 3 by ventilation as described before, but the air may be further circulated back to the external air cleaning device 6 as an outside air when required.

According to the apparatus of the present invention, the outside air is introduced into the clean room 1 after eliminating fine grain such as dust by the external air cleaning device 6. Then part of the introduced outside air is taken by the pre-stage air cleaning and ventilating means 12 and is taken into the air duct 8 after eliminating organic gas, ozone or the like through the chemical filter 10 an the rest of the introduced air is directly supplied to the work area 3.

And gas-eliminated cleaned-up air is fed to individual air duct section 8B1 and 8B2, and further being cleaned up by the first and second post-stage air cleaning and ventilating means 141 and 142. And thus obtained super cleaned-up air is respectively supplied into chambers 21c and 22c *of the processing apparatuses 21 and 22*.

A substrate to be processed is loaded into the chambers 21c and 22c of the processing apparatuses 21 and 22, and necessary processes such as a CVD process, a diffusion process, an etching process, a cleaning process or the like are executed simultaneously or sequentially.

According to the manufacturing apparatus of the present invention as above described, the chemical filter 10 is installed not only for elimination of fine grain but also for gas, so that the organic gas such as chemically polluted gas is effectively eliminated, and accordingly a high performance semiconductor device can be manufactured with high reliability and with high yield.

And according to the present invention, the common air duct section 8A is provided common to the plurality of processing apparatuses 21 and 22 and the above-mentioned chemical filter 10 is provided to this common air duct section 8A simplification of the structure, miniaturization of whole apparatuses, easy maintenance as compared to a case where the chemical filter 10 is provided to each of processing devices.

In the embodiment shown in the figure, two processing apparatuses 21 and 22 are installed within the same clean room 1, but another modification is available where three or more of the processing apparatuses (might be over 100 processing apparatuses) are installed within the same clean room 1.

For example, in the semiconductor manufacturing and processing apparatus employing multi-bath type cleaning apparatus, namely in a cleaning bath of a loader and an un-loader for loading and unloading substrate to be processed is a closed type cleaning bath, it is possible to apply various modifications including such construction that the super cleaned-up air from the individual duct is limitedly supplied to the installation location of the loader and un-loader.

What is claimed is:

1. A manufacturing method for a semiconductor device wherein a plurality of semiconductor manufacturing and processing apparatuses are installed in a clean room, comprising:
    an external air cleaning device connected to a supply port of said clean room for supplying a cleaned-up outside air into said clean room;
    an air duct comprising a common air duct section for constructing common air pass to said plurality of semiconductor manufacturing and processing apparatuses in said clean room and an individual air duct section branched off from said common air duct section for constructing individual air pass to each of said plurality of semiconductor manufacturing and processing apparatuses;
    pre-stage air cleaning and ventilating means having a chemical filter and fan for further cleaning a part of said cleaned-up outside air supplied by said external air cleaning device at an entrance of said common air duct section; and
    post-stage air cleaning and ventilating means having a fan filter unit at each of said individual air duct section for supplying a further cleaned-up outside air by said supplying said post-stage air cleaning and ventilating means to each of said plurality of semiconductor manufacturing and processing apparatuses.

2. The manufacturing method as cited in claim 1, wherein said second air cleaning and ventilating means includes a minute difference pressure damper.

3. A manufacturing method for a semiconductor device wherein a plurality of semiconductor manufacturing and processing apparatuses are installed in a clean room, comprising the steps of:
    supplying a cleaned-up outside air by an external air cleaner into said clean room;
    supplying a part of said cleaned-up outside air to a common air duct means through a pre-stage air cleaning and ventilating means having a chemical filter;
    supplying a branched off air from said common air duct means to each of said plurality of semiconductor manufacturing and processing apparatuses through a fan filter unit by way of an individual air duct section.

4. The manufacturing method as cited in claim 3, wherein said second air cleaning and ventilating means includes a minute difference pressure damper.

* * * * *